United States Patent

Taylor

[11] 4,301,383
[45] Nov. 17, 1981

[54] COMPLEMENTARY IGFET BUFFER WITH IMPROVED BIPOLAR OUTPUT

[75] Inventor: David L. Taylor, Carrollton, Tex.

[73] Assignee: Harris Corporation, Melbourne, Fla.

[21] Appl. No.: 82,185

[22] Filed: Oct. 5, 1979

[51] Int. Cl.³ .......................................... H03K 17/687
[52] U.S. Cl. .................................. 307/585; 307/446; 307/DIG. 1; 307/303
[58] Field of Search ............... 307/446, 585, 279, 288, 307/DIG. 1, 303, 304

[56] References Cited

U.S. PATENT DOCUMENTS

| | | | |
|---|---|---|---|
| 3,541,353 | 11/1970 | Seelback et al. | 307/446 |
| 3,591,855 | 7/1971 | Dean et al. | 307/DIG. 1 |
| 3,601,630 | 8/1971 | Redwine | 307/303 X |
| 3,609,479 | 9/1971 | Chang Lin et al. | 307/304 |
| 3,631,528 | 12/1971 | Green | 307/303 X |
| 3,636,372 | 1/1972 | Hujita et al. | 307/303 X |
| 3,649,843 | 3/1972 | Redwine et al. | 307/446 |

Primary Examiner—Eugene R. LaRoche
Attorney, Agent, or Firm—Leitner, Palan, Martin & Bernstein

[57] ABSTRACT

A buffer having a first and second complementary IGFET input inverter connected in series and an output including a bipolar emitter follower with its base connected to the output of the first inverter, a second bipolar transistor connected in series with the emitter follower with its base connected to the output of the second inverter and an IGFET connected between the junction of the bipolar transistors and a voltage supply terminal and with its gate connected to the input of the first inverter. The output IGFET pulls the buffer output up to the supply voltage when the emitter of the emitter follower is at the supply voltage minus $V_{BE}$.

3 Claims, 3 Drawing Figures

COMPLEMENTARY IGFET BUFFER WITH IMPROVED BIPOLAR OUTPUT

BACKGROUND OF THE INVENTION

The present invention relates generally to complementary insulated gate field effect transistor (IGFET) amplifiers and more particularly to complementary IGFET amplifiers with emitter follower outputs.

One of the major design criterion of semiconductor circuits is that individual circuit elements be small to enable high packing density as well as consume small amounts of power. Complementary IGFETs consume smaller amounts of power and have higher switching speeds than other types of semiconductor structures. By reducing the size of the IGFET device, the on resistance becomes high. When the load to the output stage is capacitive, the switching speed becomes unsatisfactorily low.

The output structure of IGFET buffers generally consist of large P channel and N channel devices to provide reasonable drive and sink capabilities. Typically, a P channel pull-up device is 300 times an internal minimum size device and a typical N channel pull-down device is 200 times a internal minimum size device.

Instead of increasing the size of the output stage IGFETs, the prior art has incorporated bipolar devices in the output stage. A typical example is U.S. Pat. No. 3,636,372 to Hujita, et al when includes a transistor and an emitter-follower configuration and a load impedance or resistance in series with the emitter. As illustrated in FIG. 1, the input inverter includes a complementary pair of insulated gate field effect transistors $Q_1$ and $Q_2$ connected in an inverter structure. The output stage includes a bipolar transistor $Q_3$ connected to the output of the inverter with a load resistance RE and an output capacitance $C_{out}$ connected to the emitter. With this configuration, although improving drive capacity with a minimum amount of space or surface area used, the achievable speed is dictated by the output resistance and substantial power is consumed. Also, the maximum achievable output voltage is the supply voltage minus one base to emitter diode voltage drop ($V_{CC}-V_{BE}$). Assuming a typical output capacitance of 100 picofarads and an output load resistance of approximately 100 ohms in order to provide a high to low transition time constant of 10 nanoseconds, a static power consumed by such an output structure would be approximately 210 milliwatts. This condition would effectively defeat the purpose of using complementary IGFET devices to minimize power consumption.

FIG. 1 of the prior art also illustrates the difficulty of having an output voltage of a maximum static high level of $V_{CC}-V_{BE}$. If the output is connected to other complementary IGFET inverters, illustrated as, for example, $Q_4$ and $Q_5$, a high output voltage less than $V_{CC}$, would turn on all P channel devices, for example, $Q_4$ if the threshold voltage of $Q_4$ is less than $V_{BE}$. Thus, all interface P channel devices would be slightly on while all N channel interface devices are also substantially on. This condition leads to undesirable static power consumption in other CMOS devices which are interfaced.

In addition to incapatibility with IGFET structures, the buffer of FIG. 1 is also incompatible or causes problems with transistor to transistor logic (TTL). For the buffer $Q_1$, $Q_2$, $Q_3$, to sink TTL logic $Q_6$, $Q_7$, $Q_8$, $R_1$, $R_2$, and $R_3$ having a static load of 10 milliamps and RE of 100 ohms, the output of the buffer would be one volt. This output low voltage is greater than the maximum input voltage of approximately 0.8 volts to the TTL circuit. Thus, the logic low voltage required to provide appropriate current sink is as incompatible with TTL logic as the high level logic is incompatible with complementary IGFET logic.

To reduce the output impedance, the load resistor RE has been replaced by another MOS device as shown in U.S. Pat. No. 3,601,630. Also, the output stage may include a second bipolar transistor in series with the emitter-follower output transistor as illustrated in U.S. Pat. No. 3,609,479. Although both these patents improve the output impedance of the buffer, the circuits still can only provide an output high logic level of $V_{CC}-V_{BE}$. Thus, they no not solve one of the major drawbacks of the prior art buffer circuits.

SUMMARY OF THE PRESENT INVENTION

The present invention solves the problems of the prior art by providing an additional insulated gate field effect transistor device in the bipolar output circuit to pull-up the output to a logic high of the supply voltage when the emitter-follower output bipolar transistor is at the supply voltage minus the base to emitter voltage drop. The input circuit is a pair of complementary insulated field effect transistor inverters connected in series and the output circuit includes the first bipolar emitter follower having its input connected to the output of the first inverter and its emitter connected to the buffer output. A second bipolar transistor connected in series with the first bipolar transistor has its collector connected to the buffer output and its base connected to the output of the second inverter. An output insulated gate field effect transistor has its gate connected to the input of the first inverter and its source-drain path connected between the supply voltage and the emitter of the emitter follower bipolar transistor. For a logic low output, the second bipolar transistor conducts in a saturated state to produce the logic low. For a logic high output, the emitter follower conducts to provide an appropriate output and the output insulated gate field effect transistor pulls the output voltage to a logic high of the supply voltage when the emitter follower output is the supply voltage minus base to emitter voltage drop.

An object of the present invention is to provide a complementary insulated gate field effect transistor with bipolar output structure wherein the logic high of the supply voltage is achievable.

Another object of the present invention is to provide a complementary insulated gate buffer with bipolar output structure without the disability of prior art buffers.

These and other objects of the present invention will become apparent when considered in conjunction with the detailed description of the preferred embodiments.

DESCRIPTION OF THE PREFERRED EMBODIMENTS

Figure 2:
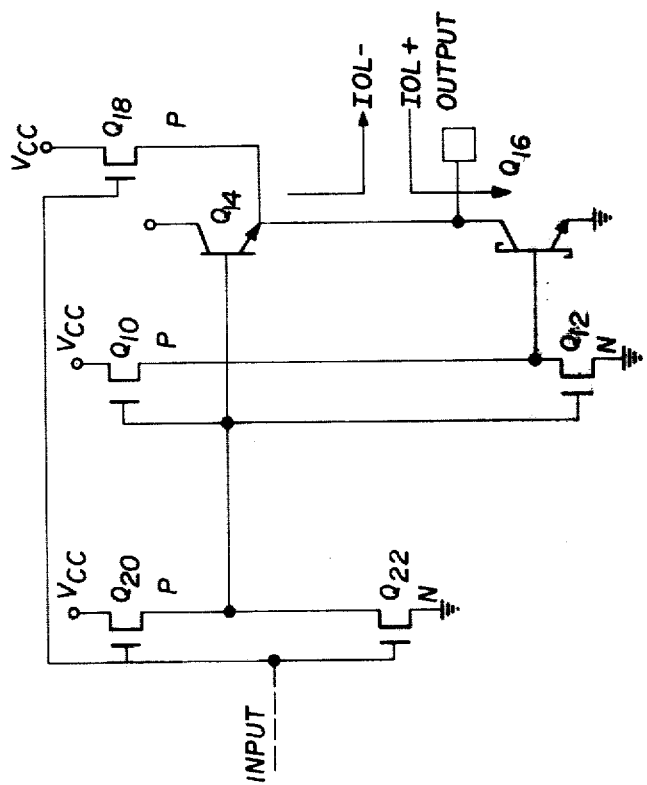
FIG. 2 is a schematic of a buffer incorporating the principles of the present invention.
Figure 1:
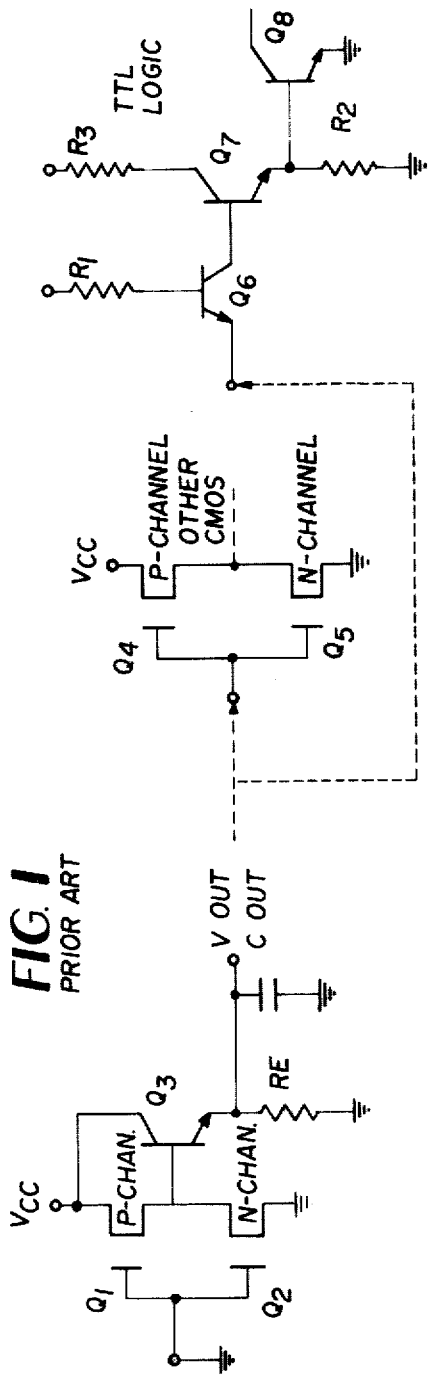
FIG. 1 is a schematic of a buffer of the prior art.

FIG. 2 illustrates a buffer incorporating the principles of the present invention including first and second input inverters having complementary insulated gate field effect transistors $Q_{20}$, $Q_{22}$ and $Q_{10}$, $Q_{12}$, respectively. The buffer input is connected to the gates or input of the first input inverter. The input of the second input inverter is connected to the output of the first input inverter. The output structure includes a bipolar emitter follower $Q_{14}$ having its base connected to the output of the first inverter of transistors $Q_{20}$ and $Q_{22}$, its collector connected to the supply voltage $V_{CC}$, and its emitter connected to the output. A second bipolar transistor $Q_{16}$ has its collector connected to the output, its emitter grounded and its base connected to the output of the second inverter of transistors $Q_{10}$ and $Q_{12}$. An output insulated gate field effect transistor $Q_{18}$ has its gate connected to the input of the first inverter of transistors $Q_{20}$ and $Q_{22}$ and its drain-source path connected between the supply voltage $V_{CC}$ and the emitter of emitter follower $Q_{14}$. The insulated gate field effect transistors $Q_{10}$, $Q_{18}$ and $Q_{20}$ are illustrated as P channel devices, and insulated gate field effect transistors $Q_{12}$ and $Q_{22}$ as N channel devices. Bipolar transistor $Q_{14}$ is illustrated as an NPN bipolar transistor and bipolar transistor $Q_{16}$ is illustrated as an NPN Schottky bipolar transistor.

Whenever the input is a high of $V_{CC}$, transistors $Q_{20}$, $Q_{12}$, $Q_{14}$, and $Q_{18}$ are off and transistors $Q_{22}$, $Q_{10}$ and $Q_{16}$ are on. The base drive for output bipolar transistor $Q_{16}$ is set by the size of P channel device $Q_{10}$. Output bipolar transistor $Q_{16}$ will be on and operated in a saturated condition with the logic low output voltage being set by the device offset characteristics and the on resistance of bipolar transistor $Q_{16}$. For typical bipolar transistor $Q_{16}$ having an on resistance of 10 ohms, this will provide a logic low output voltage of 310 millivolts for a logic low output current of 16 milliamps. Since the typical beta of an NPN $Q_{16}$ of 300 can be obtained, the base drive for $Q_{16}$ could be very small (namely approximately 0.1 milliamps.) This small drive current provided by transistor $Q_{10}$ will minimize the power consumed by the output structure.

When the logic input is low, transistors $Q_{22}$, $Q_{10}$ and $Q_{16}$ will be off and transistors $Q_{20}$, $Q_{12}$, $Q_{14}$, $Q_{18}$ will be on. With insulated gate field effect transistors $Q_{12}$ on, the base of output transistor $Q_{16}$ is clamped to ground and therefore held off. The base of output emitter follower $Q_{14}$ is pulled up to $V_{CC}$ by transistor $Q_{20}$ and will provide a large output current drive until the required output drive is small. The output insulated gate field effect transistor $Q_{18}$ will provide a final pull up to the supply voltage $V_{CC}$ and cut off the emitter follower $Q_{14}$. This assures that the output voltage for the logic high is a supply voltage $V_{CC}$ and not the supply voltage $V_{CC}$ minus the base to emitter forward voltage drop $V_{BE}$. The output current of the buffer of FIG. 2 will be set by the size of $Q_{20}$ which sets the base drive for the output transistor $Q_{14}$. By using complementary insulated gate field effect transistors which may be self-isolating in a substrate and an NPN emitter follower which is also self-isolating in a substrate, a minimum amount of chip area is needed to provide the buffer of the present invention.

Figure 3:
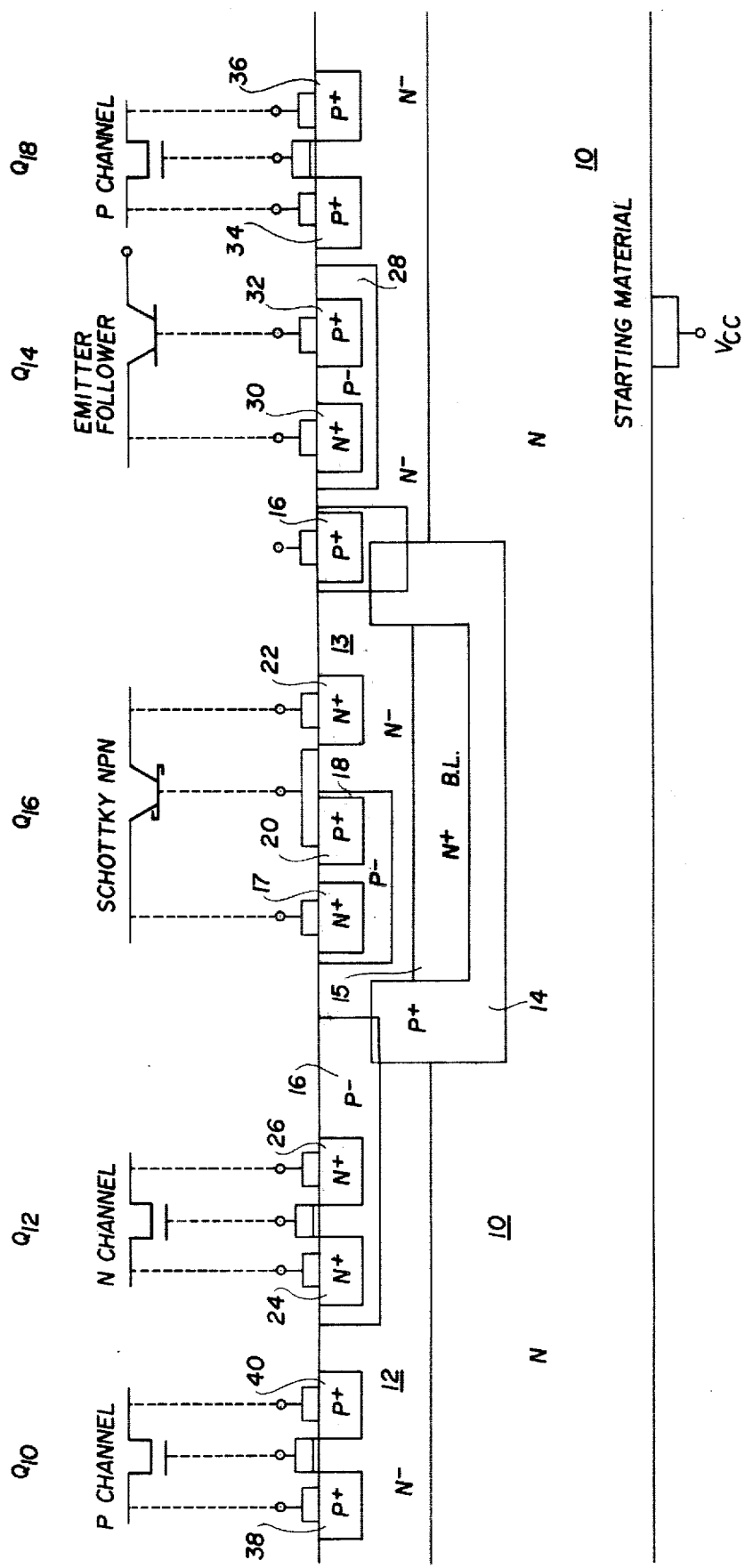
FIG. 3 is a cross-sectional view of an integrated circuit of the schematic of FIG. 2.

FIG. 3 illustrates a cross-section of an integrated circuit incorporating the buffer of FIG. 2 except for the first input inverter for sake of clarity. An N conductivity type substrate 10 has an epitaxial N-layer 12 thereon. A buried P+ region 14 in combination with a surface P− ring 16 isolates a portion 13 of the N− epitaxial layer 12. In this isolated region 13 is formed the Schottky output NPN transistor $Q_{16}$ including an N+ emitter 17 formed in a P-base 18 with the isolated N− epitaxial region forming the collector. A P+ base contact region 20 is shorted to the collector by a single metallic contact to form the base contact and Schottky diode. A collector contact region 22 is formed in the isolated N− epitaxial collector region. A buried N+ layer 15 may be formed in the isolated region 13. In the guard region 16 are formed N+ source and drain regions 24 and 26 of N channel insulated gate field effect transistor $Q_{12}$. The output emitter follower $Q_{14}$ includes an N+ emitter 30 formed in a P− base region 28 having a base P+ base contact 32. The N− epitaxial layer and N substrate form the collector of the emitter follower $Q_{14}$. The P channel insulated gate field effect transistors $Q_{18}$ and $Q_{10}$ include P+ source and drain regions 34, 36 and 38, 40, respectively formed in the N− epitaxial region layer 12. The integrated circuit of FIG. 4 shows self-isolating insulated gate field effect transistors and an emitter follower and a junction isolated Schottky output transistor. This self-isolation reduces the surface area needed. These devices may be fabricated using self-aligned insulated gate field effect transistor processes. Thus, they are readily attainable using standard processing techniques without major revisions to the process.

From the preceding description of the preferred embodiments, it is evident that the objects of the invention are attained in that an insulated gate field effect transistor having an emitter follower bipolar output structure is provided which is capable of an output logic high of the supply voltage. Although the invention has been described and illustrated in detail, it is to be clearly understood that the same is by way of example and illustration only and is not to be taken by way of limitation. The spirit and scope of the present invention are to be limited only by the terms of the appended claims.

What is claimed:

1. A switching circuit comprising:
   a first complementary insulated gate field effect transistor inverter having an input and an output, said input forming the input terminal of the circuit;
   a second complementary insulated gate field effect transistor inverter having an input connected to the output of said first inverter and an output;
   a first bipolar transistor being connected in an emitter follower configuration with its base connected to the output of said first inverter;
   a second bipolar transistor having its base connected to the output of said second inverter and its emitter-collector path connected in series with the emitter-collector path of said first bipolar transistor, the junction of said emitter-collector paths forming the output terminal of said circuit; and
   an insulated gate field effect transistor having its gate connected to the input of said first inverter and its source-drain path connected between a voltage supply terminal and said output terminal.

2. The switching circuit according to claim 1 wherein said first and second bipolar transistors are NPN and said insulated gate field effect transistor is a P channel device.

3. A switching circuit comprising:
   a complementary insulated gate field effect transistor inverter having an input and an output;
   a first bipolar transistor being connected in an emitter follower configuration with its base connected to the input of said inverter;

a second bipolar transistor having its base connected to the output of said inverter and its emitter-collector path connected in series with the emitter-collector path of the first bipolar transistor, the junction of said emitter-collector paths forming an output terminal; and means connected to the emitter of said first bipolar transistor for pulling the output terminal voltage to a first voltage level when the base of said first bipolar transistor is at said first voltage level and the emitter of said first bipolar transistor is at said first voltage level minus a base emitter voltage drop.

* * * * *